(12) United States Patent
O'Dell et al.

(10) Patent No.: US 6,452,982 B1
(45) Date of Patent: Sep. 17, 2002

(54) METHOD AND SYSTEM FOR-DOWN-CONVERTING A SIGNAL

(75) Inventors: Stewart C. O'Dell, Richardson; Clint D. Schreiner, Garland; Gerald L. Fudge, Plano; Michael R. Legako, Rowlett, all of TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/393,740

(22) Filed: Sep. 10, 1999

(51) Int. Cl.[7] ............................................. H04B 1/10
(52) U.S. Cl. ...................................... 375/316; 375/350
(58) Field of Search ............................... 375/323, 316, 375/350; 348/398; 708/300, 313, 322

(56) References Cited

U.S. PATENT DOCUMENTS

| | | | | |
|---|---|---|---|---|
| 4,959,863 A | * | 9/1990 | Azuma et al. | 380/38 |
| 5,612,975 A | * | 3/1997 | Becker et al. | 375/319 |
| 5,640,416 A | | 6/1997 | Chalmers | 375/206 |
| 5,699,363 A | * | 12/1997 | Wishart et al. | 370/497 |
| 5,841,811 A | | 11/1998 | Song | 375/235 |

FOREIGN PATENT DOCUMENTS

| | | |
|---|---|---|
| EP | 0 322 027 | 6/1989 |
| WO | WO 99/30413 | 6/1999 |

OTHER PUBLICATIONS

Rod Green and Richard Hosking, "High Performance Direct Conversion", Electronics World, pp. 18–22, Jan. 1999.
PCT Internation Search Report for PCT/US00/23939, Feb. 8, 2001.

* cited by examiner

*Primary Examiner*—Don N. Vo
(74) *Attorney, Agent, or Firm*—Baker Botts L.L.P.

(57) ABSTRACT

A system is provided for down-converting a narrow band signal that includes a polyphase filter having a specified number of filter branches. The polyphase filter is operable to decimate the signal by a decimation factor based on the specified number of filter branches. A channel mixer is coupled to the polyphase filter. The channel mixer is periodic with a period of twice the specified number of filter branches.

34 Claims, 5 Drawing Sheets

METHOD AND SYSTEM FOR DOWN-CONVERTING A SIGNAL

TECHNICAL FIELD OF THE INVENTION

This invention relates generally to digital receivers and more particularly to an improved method and system for down-converting a signal.

BACKGROUND OF THE INVENTION

Communication systems send signals to communicate information, such as voice, image or other data, from one communication device to another. In many applications, the signal is modulated into an analog transmission signal that acts as a carrier wave to communicate the information. The analog transmission signal may be communicated in several different forms. For example, the analog transmission signal may be an electrical signal as used in a copper wire telephone transmission line. Alternatively, the analog transmission signal may be a radio frequency as used in wireless communication systems.

A typical wireless communication system generally comprises a communication device, such as a base station, satellite or the like, that communicates with another communication device over a specific radio frequency band. Conventional communication devices receive the analog transmission signal with a receiver, such as a superheterodyne receiver. A typical superheterodyne receiver includes a digital or analog down-converter that mixes the intermediate frequency signals down to baseband, or a lower intermediate frequency, and low-pass filters the mixed signals to obtain the desired result.

Digital down-converters generally outperform analog down-converters and are less sensitive to variations in parameters such as time, temperature and frequency. In addition, as digital technology advances, digital down-converters are requiring less power and can be manufactured at a lower cost. However, digital down-converters require high speed digital multipliers in order to function at a high sample rate. Thus, it has been difficult to take advantage of the performance of digital down-converters over a wide frequency range because of the correspondingly high sample rate which requires high speed digital multipliers to perform the mixing function.

For applications in which the signal bandwidth is significantly less than the tuning bandwidth, mixing and filtering are generally followed by sample rate decimation so that the sample rate is appropriate for the signal bandwidth. For applications in which the signal bandwidth is wide in comparison to the tuning bandwidth, previous down-converters have used a parallel architecture that replaces one relatively high speed multiplier with a plurality of slower multipliers. Finally, for channelizer applications that require multiple simultaneous signal channels, previous down-converters have used a polyphase filter bank with modulated filter coefficients to channelize the signal. Thus, previous down-converters require relatively low sample rates, high speed multipliers, numerous multipliers in parallel, and/or complex filtering.

SUMMARY OF THE INVENTION

In accordance with the present invention, a method and system for down-converting a signal are provided that substantially eliminate or reduce disadvantages and problems associated with previously developed systems and methods. In particular, the present invention decimates the sample rate of the signal before filtering and mixing to digitally tune a signal without high speed multipliers or complex filtering.

In one embodiment of the present invention, a system is provided for down-converting a narrow band signal that includes a polyphase filter having a specified number of filter branches. The polyphase filter is operable to decimate the signal by a decimation factor based on the specified number of filter branches. A channel mixer is coupled to the filter. The channel mixer is periodic with a period of twice the specified number of filter branches.

In another embodiment of the present invention, a method for down-converting a wide band signal is provided that includes mixing the signal with an analog mixer to produce a mixed signal. The mixed signal is band-pass filtered to produce a band-pass filtered signal. The band-pass filtered signal is converted to a digital signal. The digital signal is decimated with a polyphase filter. The polyphase filter has a specified number of filter branches. A decimation factor for decimating the signal is based on the specified number of filter branches. The digital signal is filtered with the polyphase filter to produce a plurality of filter outputs. The filter outputs are mixed with a channel mixer. The channel mixer is periodic with a period of twice the specified number of filter branches.

Technical advantages of the present invention include providing an improved method and system for down-converting a signal. In particular, decimation of the data is performed before filtering, and filtering is performed before mixing. As a result, complex filtering is avoided and slower multipliers and filters may be used. This reduces the overall cost of the down-converter. Additionally, given a maximum technology limit for mixer speed, total tuning bandwidth is significantly increased.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1:
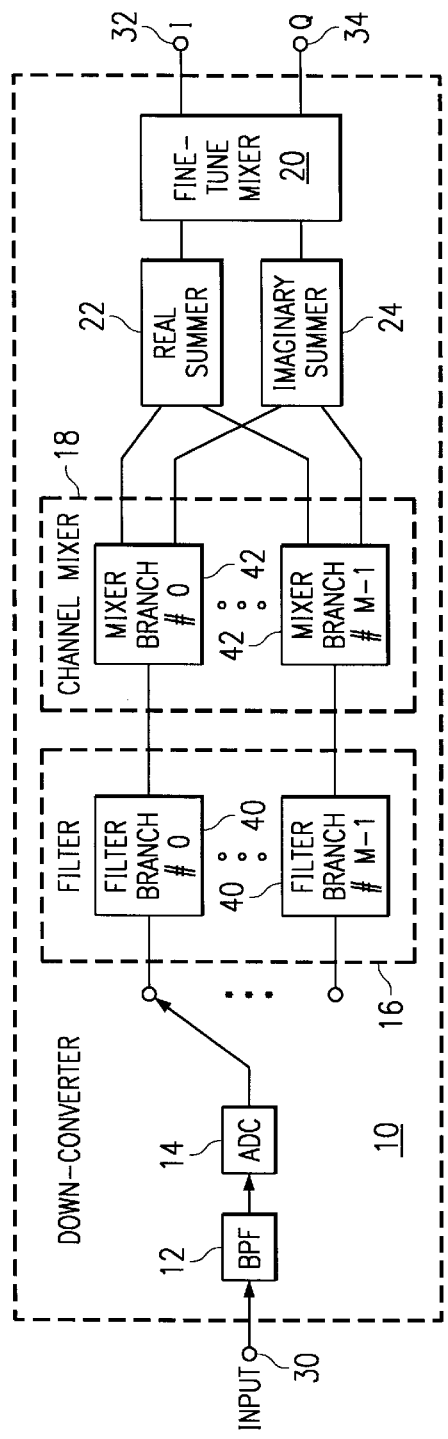
FIG. 1 is a block diagram illustrating a digital down-converter constructed in accordance with the teachings of the present invention.

FIG. 1 is a block diagram illustrating a digital down-converter 10 constructed in accordance with the teachings of the present invention. The down-converter 10 may be part of a digital receiver for use in telecommunications applications or other suitable applications requiring a tunable band-pass filter. The down-converter 10 may be used to digitally tune a relatively narrow band signal over a wide tuning bandwidth, such as a signal with a bandwidth approximately 5% or less of the tuning bandwidth. The down-converter 10 comprises a band-pass filter 12, an analog-to-digital converter 14, a polyphase decimating filter 16, a channel mixer 18 and a fine-tune mixer 20. The down-converter 10 also comprises a real summer 22, an imaginary summer 24, an input terminal 30, an in-phase output terminal 32 and a quadrature output terminal 34. As described in more detail below, the filter 16 comprises a plurality of filter branches 40, and the channel mixer 18 may comprise a plurality of corresponding mixer branches 42.

In operation, the down-converter 10 receives a signal at the input terminal 30. The signal is filtered by the band-pass filter 12 and converted into digital data by the analog-to-digital converter 14 before being passed through the filter 16. In order to prevent aliasing, the bandwidth of the filter 16 is made consistent with the decimated sample rate.

The filter 16 comprises a plurality of filter coefficients for performing the filtering function. The filter 16 separates these filter coefficients into any specified number, M, of filter branches 40 with the filter coefficients of the kth branch 40 corresponding to the plurality of filter coefficients decimated by M and time offset by k. According to one embodiment, the first filter branch 40 receives the first filter coefficient, the second filter branch 40 receives the second filter coefficient, and so on, with the Mth filter branch 40 receiving the Mth filter coefficient. The first filter branch 40 also receives the M+1th filter coefficient, the second filter branch 40 receives the M+2th filter coefficient, and so on, so that all of the filter coefficients are distributed among the filter branches 40.

The filter 16 also separates the data, sending each sample through only one of the M filter branches 40. According to one embodiment, the filter 16 sends the first sample through the first filter branch 40, the second sample through the second filter branch 40, and so on, with the Mth sample being sent through the Mth filter branch 40. The M+1th sample is then sent through the first filter branch 40, the M+2th sample is sent through the second filter branch 40, and so on, as long as samples are being received by the filter 16. Thus, in addition to filtering the data, the filter 16 decimates the data by M.

The filter coefficients for the filter branches 40 are determined by decomposing the z-transform of a linear time-invariant filter into M components as follows:

$$H(z) = \sum h(n)z^{-n}$$
$$= \sum h(Mn)z^{-Mn} + z^{-1}\sum h(Mn+1)z^{-Mn} + \ldots + z^{-(M-1)}$$
$$\sum h(Mn+(M-1))z^{-Mn}$$
$$= H_0(z^M) + z^{-1}H_1(z^M) + \ldots + z^{-(M-1)}H_{M-1}(z^M),$$

where $$H_k(z) = \Sigma h(Mn+k)z^{-n}.$$

Thus, from the above decomposition, decimation by a factor of M is combined with filtering by splitting the filter 16 into M filter branches 40, with the kth filter branch 40 having a time delay of k, and by dividing the data from the analog-to-digital converter 14 among the M filter branches 40. This allows a slower, less expensive filter 16 to be used in the down-converter 10 because each filter branch 40 filters data at only 1/Mth the data sample rate of the down-converter 10, allowing the use of relatively slow multipliers in the filter 16.

The down-converter 10 performs mixing after decimation and filtering of the digital data. The mixing function of the down-converter 10 is separated into a periodic component in the channel mixer 18 and an aperiodic component in the fine-tune mixer 20. The channel mixer 18 comprises a plurality of mixer coefficients for mixing the output from the filter 16. As described in more detail below, the mixer coefficients may be included in mixer branches 42. Let $w_k^m = e^{-j2\pi(m/N)k}$ represent the mixer coefficients used to tune the input to the mth channel, where k ranges from 0 to N−1 before the sequence repeats and where the complex value $w_k^m$ corresponds to the $W_{m,k}$ element of an N-point discrete Fourier transform (DFT) matrix W. The full set of N mixer coefficients for the mth channel is denoted by $w^m$.

The real and imaginary sign and magnitude of the complex phasor $w_k^m$ can be separated using the following notation:

$$w_k^m = x_k^m + jy_k^m$$
$$= s_R(m,k)m_R(m,k) + js_I(m,k)m_I(m,k),$$

where $S_R(m,k)$, $m_R(m,k)$, $S_I(m,k)$ and $m_I(m,k)$ represent the real and imaginary sign and magnitude of the kth element of the mth channel. Separating the real and imaginary sign and magnitude of the mixer coefficients allows the symmetries of $w^m$ to be used in order to reduce the total number of multiplies required for implementing the mixing function after the data is filtered.

The mixing function can be decomposed as follows:

$$e^{-j2\pi f_0 k} = e^{-j2\pi(m/N + f_d)k}$$
$$= e^{-j2\pi(m/N)k}e^{-j2\pi f_d k},$$

where $f_0$ represents the desired tuning frequency, m represents one of N tuning channels in the channel mixer 18 and $f_d$ represents the frequency delta to be tuned within the channel by the fine-tune mixer 20. The channel mixer 18 for the mth channel comprises a periodic sequence with period N formed from the mth harmonic $w^m$ of the N-point DFT sequence $w^1$. The N-point DFT mixer coefficients may be included in the mixer branches 42 and are assigned to the filter branches 40 after the filtering is done. As a result, only real filtering is required, which reduces the amount of filtering by half, and the mixing is performed on decimated data, which allows the use of slower multipliers. Any remaining in-channel tuning (represented by the aperiodic mixer component) is performed by the fine-tune mixer 20.

Although the mixer coefficients could be assigned uniquely to each filter branch 40 if the channel mixer 18 were periodic with a period of N=M, adjacent channels would not overlap and frequencies on channel boundaries could not be received if the total bandwidth were split into N channels with each channel decimated by M=N. Therefore, the channel mixer 18 is made periodic with a period of N=2M or other suitable multiple of M. In other words, for N=2M, the total bandwidth is split into N channels with each channel decimated by M=½N. This provides fifty percent overlap in adjacent channels. While the mixer coefficients of a channel mixer 18 with period 2M cannot generally be assigned directly to a filter 16 with M filter branches 40, the mixer coefficients can be assigned indirectly because of the fact that a DFT of length 2M has a period of M (modulo the sign), as shown below:

$$e^{-j2\pi(\frac{m}{2M})(k+M)} = e^{-j2\pi mk/2M} e^{-j\pi m}$$

Thus, for even channels, the first half of the mixer coefficients are identical to the second half. For odd channels, the magnitudes of the first and second halves of the mixer coefficients are the same, while the signs are opposite. Therefore, for even channels, the channel mixer 18 has a period of M and the mixer coefficients can be included in M mixer branches 42 that are assigned directly to the M filter branches 40. For odd channels, an alternating positive/negative, or +1/−1, multiplier is assigned to each filter branch 40, along with the first M of the mixer coefficients that are included in the M mixer branches 42. "Each" means every one of at least a subset of identified items. This results in the second M of the mixer coefficients being negated during the second half of the mixing function.

Figure 2:
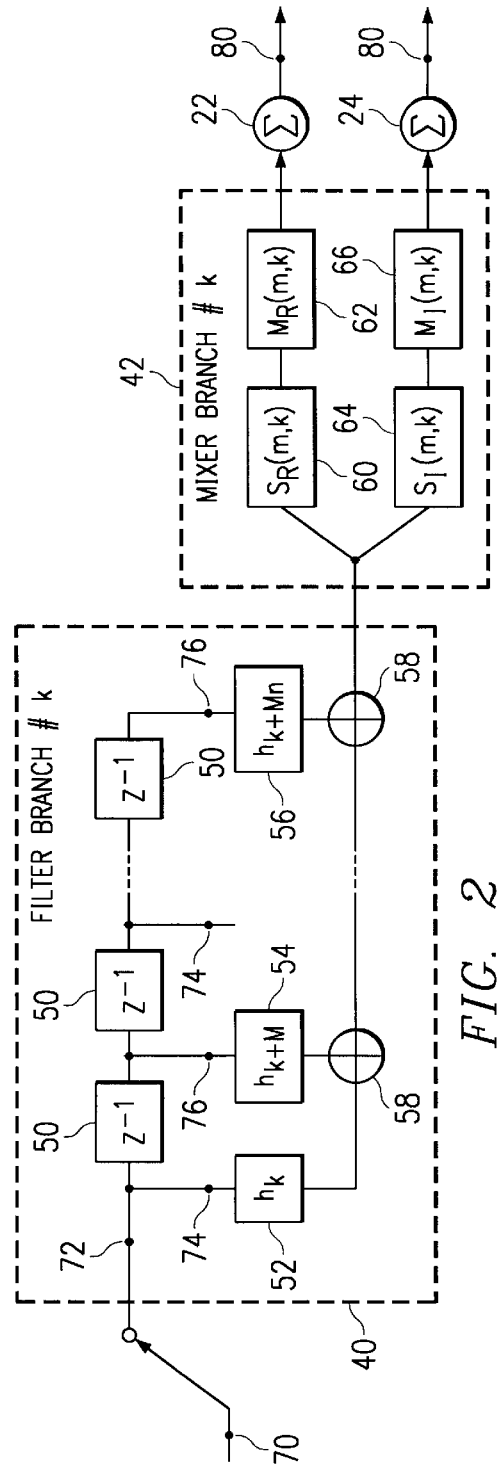
FIG. 2 is a block diagram illustrating one embodiment of a filter branch and a mixer branch for the down-converter of FIG. 1.

FIG. 2 is a block diagram illustrating one embodiment of a filter branch 40 and a mixer branch 42 for the down-converter 10 of the present invention. The filter branch 40 comprises a plurality of inverse-z delay blocks 50, a plurality of filter coefficient multiplier blocks 52, 54 and 56, and a plurality of summers 58. Although the embodiment shown in FIG. 2 includes three delay blocks 50 and three multiplier blocks 52, 54 and 56, it will be understood that these delay blocks 50 and multiplier blocks 52, 54 and 56 may be representative of any number of delay blocks and multiplier blocks. In addition, although the embodiment shown includes a plurality of summers 58, it will be understood that the summers 58 may be implemented as a single summer 58 without departing from the scope of the present invention. As data from the analog-to-digital converter 14 is received at filter branch #k 40, the data is processed by the delay blocks 50, the multiplier blocks 52, 54 and 56, and the summers 58 in order to produce the filter outputs $H_k(z^M)$, as described above.

The mixer branch 42 comprises a real sign multiplier block 60, a real magnitude multiplier block 62, an imaginary sign multiplier block 64 and an imaginary magnitude multiplier block 66. It will be understood that the sign multiplier blocks 60 and 64 may be implemented without the use of multipliers without departing from the scope of the present invention. For example, the sign multiplier blocks 60 and 64 may be implemented with sign changers or with any other component suitable for changing the sign of a piece of data. The multiplier blocks 60, 62, 64 and 66 represent the mixer coefficients for the kth branch. Data received at the mixer branch 42 from the filter branch 40 is multiplied by the real multiplier blocks 60 and 62 to produce a real output and by the imaginary multiplier blocks 64 and 66 to produce an imaginary output. The real output is sent to the real summer 22, and the imaginary output is sent to the imaginary summer 24.

As opposed to being placed downstream of the filter 16, the mixer coefficients could be introduced at terminal 70. However, this requires the filter 16 to provide complex filtering. As discussed above, the mixer coefficients may instead be moved downstream of the filter 16 for even channels, as illustrated by the mixer branch 42 in FIG. 2. For odd channels, a +1/−1 multiplier can be introduced at terminal 72, in addition to the mixer branches 42 downstream of the filter 16. As an alternative to the +1/−1 multiplier at terminal 72, a +1/−1 multiplier could be introduced at terminals 74 and a −1/+1 multiplier could be introduced at terminals 76, where the terminals alternate between terminals 74 and 76. This arrangement of alternating +1/−1 and −1/+1 multipliers is a result of the delays from one delay block 50 to the next. In yet another alternative, the −1/+1 multipliers at terminals 76 can be replaced with +1/−1 multipliers by negating the corresponding filter coefficients. According to the embodiment shown in FIG. 2, the filter branch 40 includes an even number of multiplier blocks 52, 54 and 56, as indicated by the final multiplier block 56 corresponding to a terminal 76. Thus, for this embodiment, the filter coefficients included in multiplier blocks 54 and 56 are negated. It will be understood that, for an odd number of multiplier blocks 52, 54 and 56, the final multiplier block 56 would follow a terminal 74 instead of a terminal 76 and would not be negated. Thus, since each terminal 74 and 76 at each filter branch 40 in this alternative has the same +1/−1 multiplier, the +1/−1 multipliers can be pulled out of the filter branches 40 and introduced after the summers 22 and 24 at terminals 80.

Figure 3A:
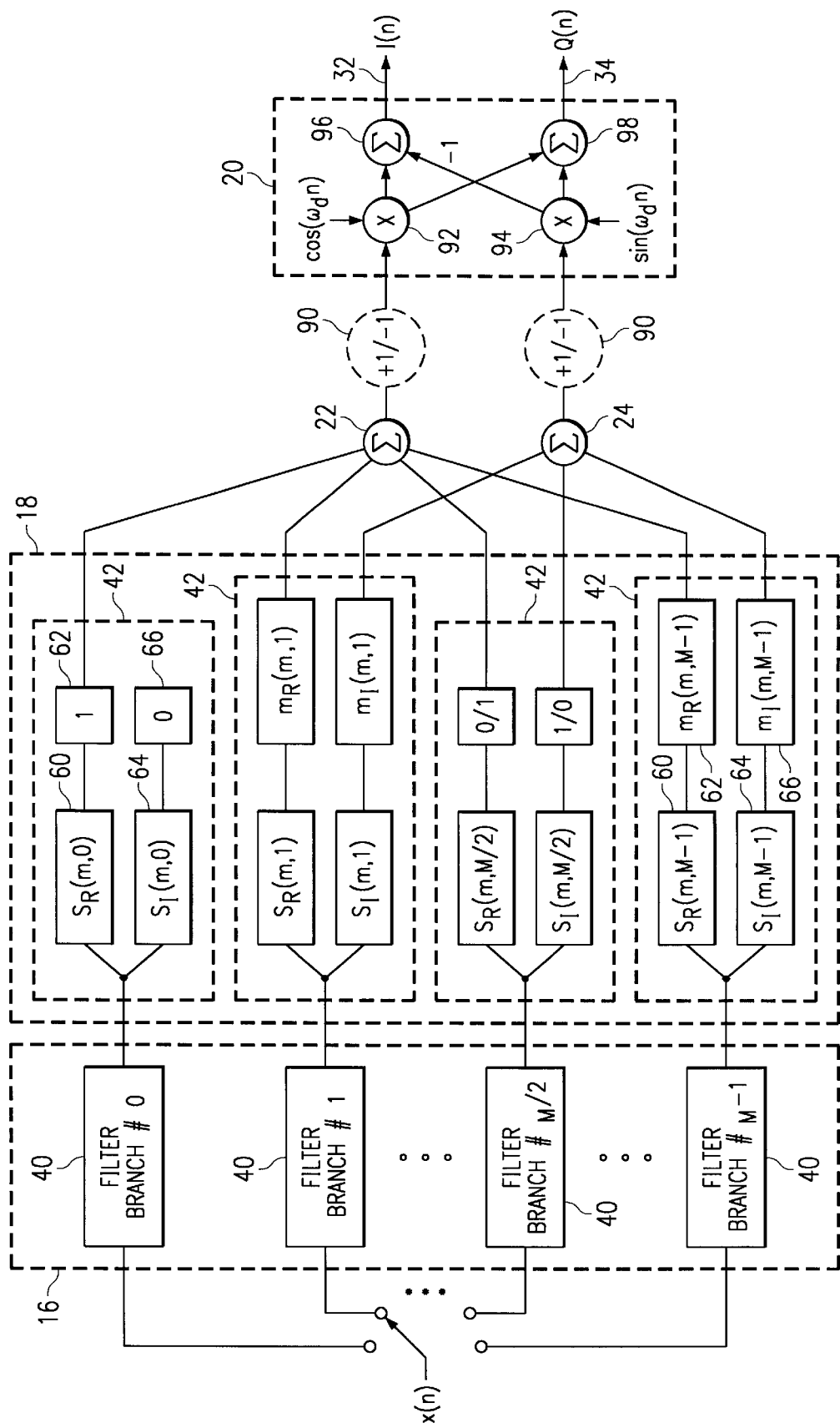
FIGS. 3A–C are block diagrams illustrating embodiments of the filter and channel mixer for the down-converter of FIG. 1.

FIG. 3A is a block diagram illustrating one embodiment of a filter 16 and a channel mixer 18 for a down-converter 10. According to this embodiment, each filter branch 40 has a corresponding mixer branch 42. Each mixer branch 42 comprises real and imaginary multiplier blocks 60, 62, 64 and 66, as described above in connection with FIG. 2. The real magnitude multiplier block 62 for the mixer branch 42 corresponding to k=0 is simply a 1 and the imaginary magnitude multiplier block 66 is a 0 due to the fact that the mixer phasor for this first mixer branch 42 is always at either 0° or 180°. Similarly, the mixer phasor for the mixer branch 42 corresponding to k=M/2 is always at either 0°, 90°, 180° or 270°. Thus, the real magnitude multiplier block 62 and the imaginary magnitude multiplier block 66 for this mixer branch 42 are always either 1 or 0.

As described above, data from the analog-to-digital converter 14 is passed to the filter 16 where each sample goes through one filter branch 40 and is then passed to a corresponding mixer branch 42. The real outputs from the mixer branches 42 are passed to the real summer 22, and the imaginary outputs from the mixer branches 42 are passed to the imaginary summer 24. For odd channels, the data from the summers 22 and 24 is then passed through +1/−1 multipliers 90, and alternating filter coefficients in the filter branches 40 are negated as previously described.

The data from the summers 22 and 24 for even channels, or from the +1/−1 multipliers 90 for odd channels, is passed to the fine-tune mixer 20. The fine-tune mixer 20 comprises a cosine multiplier 92, a sine multiplier 94, a first summer 96 and a second summer 98. The cosine multiplier 92 multiplies the output of the real summer 22, or the +1/−1 multipliers 90, by $\cos(\omega_d n)$, where $\omega_d$ represents the frequency delta described above. The sine multiplier 94 multiplies the output of the imaginary summer 24, or the +1/−1 multipliers 90, by $\sin(\omega_d n)$. The first summer 96 subtracts the output of the sine multiplier 94 from the output of the cosine multiplier 92 to produce an in-phase output at the in-phase output terminal 32. The second summer 98 adds the output of the cosine multiplier 92 to the output of the sine multiplier 94 to produce a quadrature output at the quadrature output terminal 34.

Figure 3B:
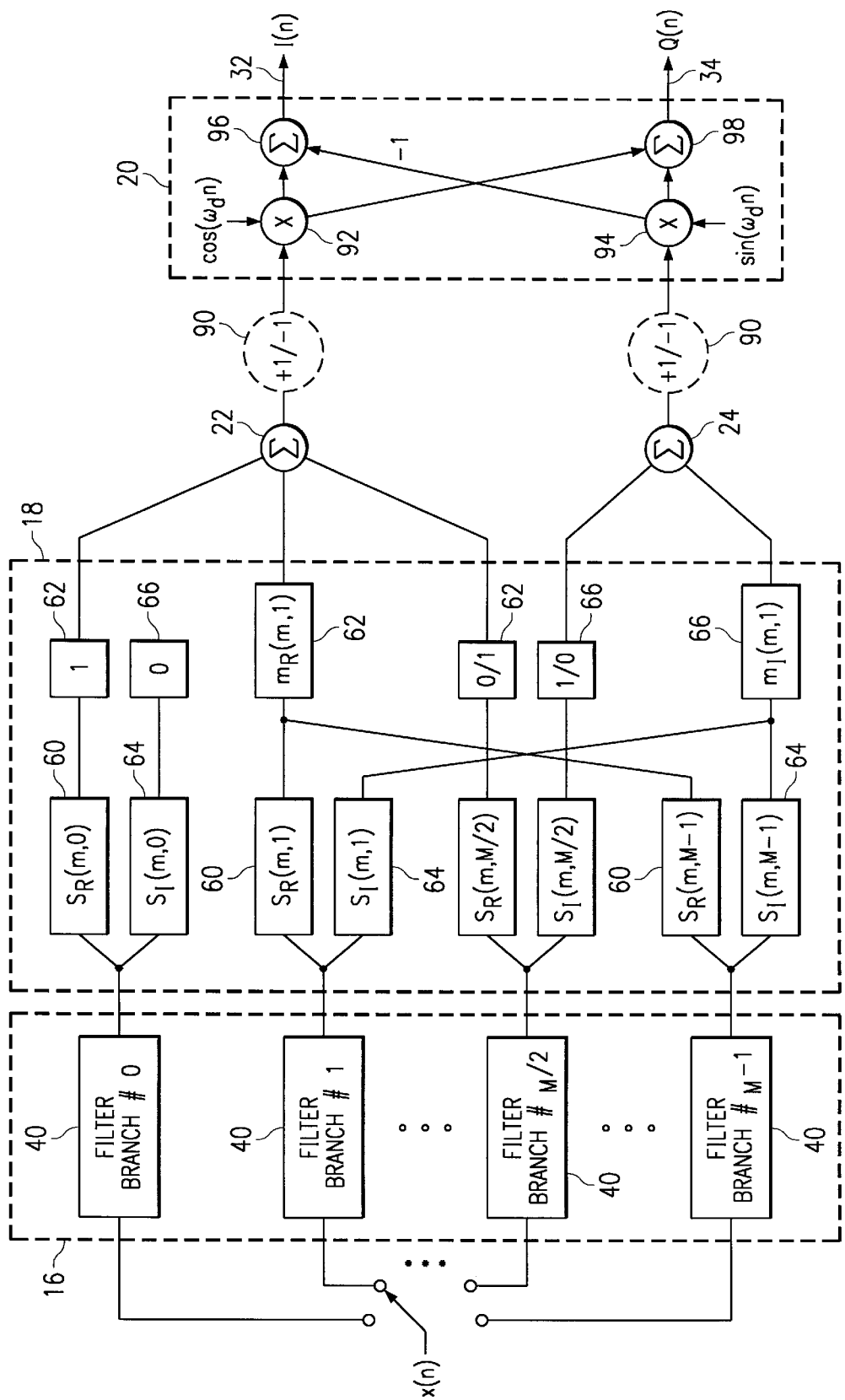

FIG. 3B is a block diagram illustrating a second embodiment of a channel mixer 18 for down-converter 10. According to this embodiment, a portion of the mixer coefficients are shared, making use of the symmetries in the channel mixer 18. Thus, in this embodiment, the mixer coefficients are not included in separate mixer branches 42. Instead, the output from a filter branch 40 is passed to a real sign multiplier block 60 and an imaginary sign multiplier block 64. From the sign multiplier blocks 60 and 64, the data is passed to shared magnitude multiplier blocks 62 and 66. For systems designed using application-specific integrated circuits for the filters 16 or for systems with filters 16 specially designed to minimize the size of the filter multiplier, this embodiment substantially reduces the cost and size of the required components by reducing the mixer multipliers.

Figure 3C:
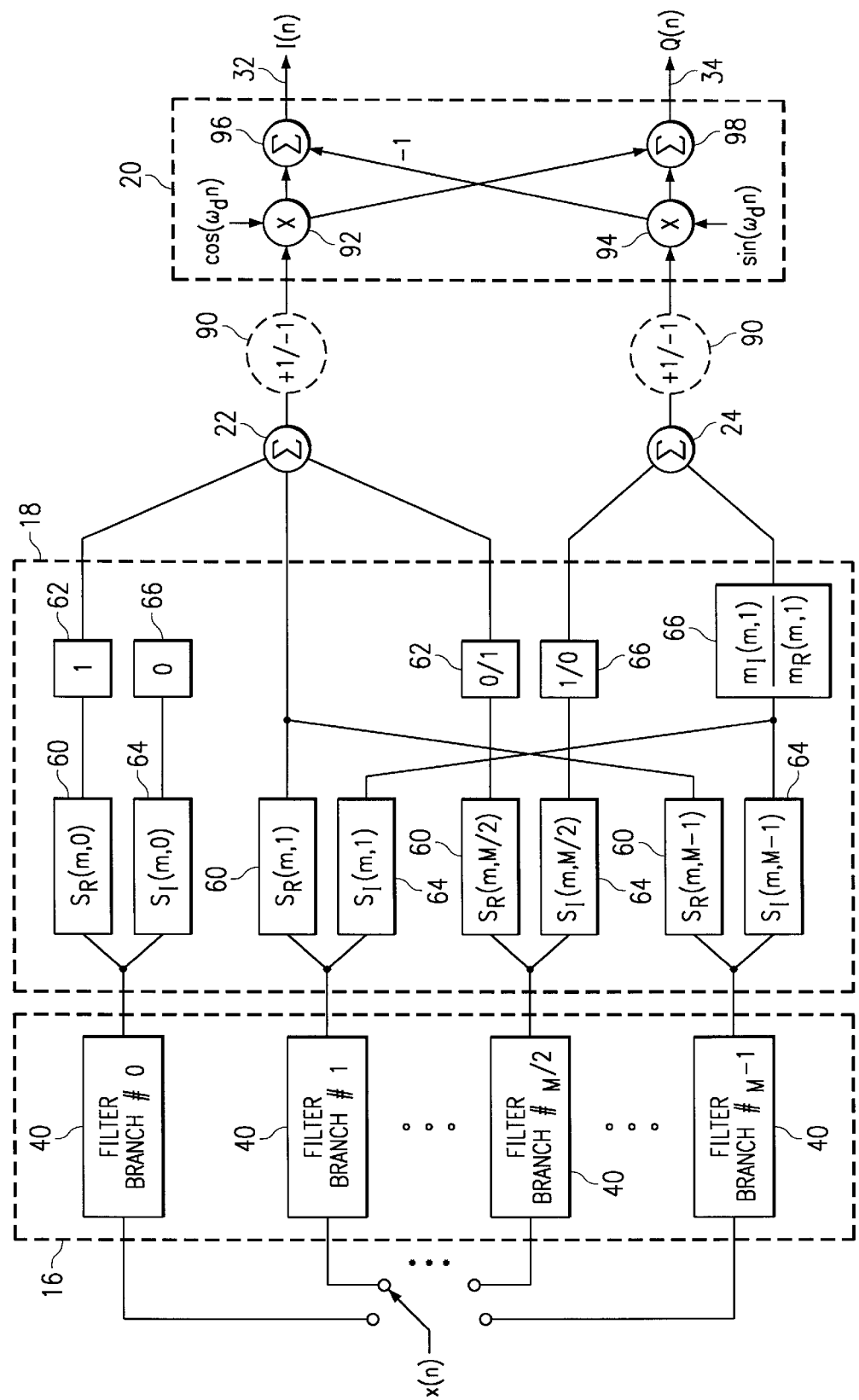

FIG. 3C is a block diagram illustrating a third embodiment of a channel mixer 18 for a down-converter 10. This embodiment is a variation of the embodiment shown in FIG. 3B. The symmetries are again used to allow sharing of the magnitude multiplier blocks 62 and 66. However, this embodiment moves the mixer coefficients corresponding to the real magnitude multiplier blocks 62 into the filter coefficients. Thus, the filter coefficients in the filter branches 40 are multiplied by the mixer coefficients from the corresponding real magnitude multiplier blocks 62. This allows unity gain for data from a filter branch 40 that is passed through a real sign multiplier block 60. Mixer coefficients in the imaginary magnitude multiplier block 66 are divided by the mixer coefficients of the removed real magnitude multiplier blocks 62 because the multiplied filter coefficients affect data that is passed through the imaginary sign blocks 64, as well as the real sign blocks 60.

Figure 4:
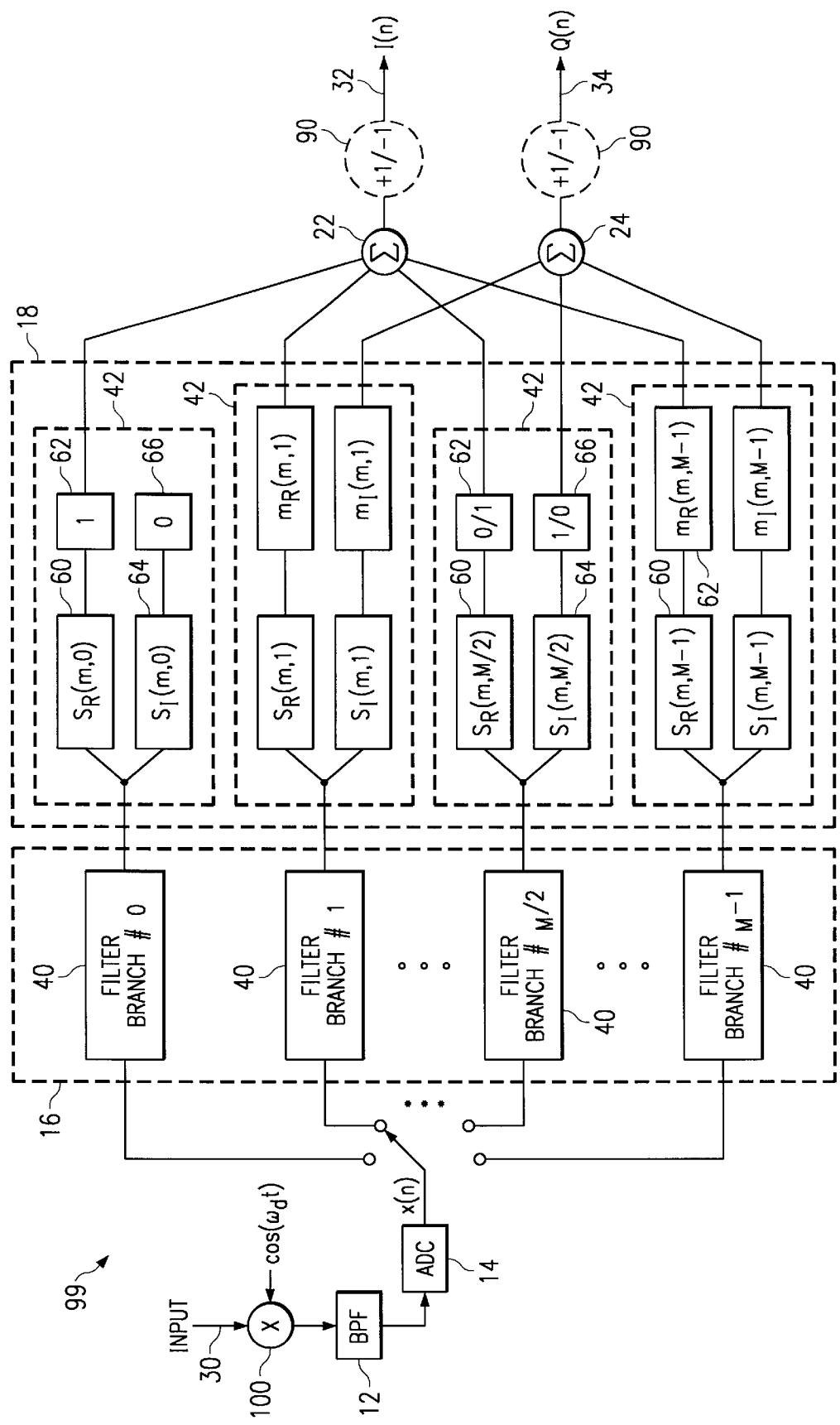
FIG. 4 is a block diagram illustrating an analog/digital down-converter constructed in accordance with the teachings of the present invention.

FIG. 4 is a block diagram illustrating an analog/digital down-converter 99 constructed in accordance with the teachings of the present invention. The analog/digital down-converter 99 comprises the same components as the digital down-converter 10, with the exception of the fine-tune mixer 20. Instead of the fine-tune mixer 20, the analog/digital down-converter 99 comprises an analog mixer 100. This down-converter 99 may be used to digitally tune a wide band signal over a wide tuning bandwidth, such as a signal with a bandwidth approximately 50% or less of the tuning bandwidth.

According to the embodiment shown in FIG. 4, the filter 16 and the channel mixer 18 are identical to those in the embodiment shown in FIG. 3A. It will be understood, however, that the channel mixer 18 shown in FIGS. 3B and 3C may be used in this embodiment without departing from the scope of the present invention. In this embodiment, data received at the input terminal 30 of the down-converter 10 is passed through the analog mixer 100 before being received by the band-pass filter 12. Using the analog mixer 100 in this manner provides full tuning flexibility which optimizes bandwidth utilization. This embodiment provides better performance than a pure analog system because the analog mixer 100 operates over a greatly reduced frequency range and avoids the requirement of a high speed digital mixer.

Although the present invention has been described with several embodiments, various changes and modifications may be suggested to one skilled in the art. It is intended that the present invention encompass such changes and modifications as fall within the scope of the appended claims.

What is claimed is:

1. A system for down-converting a narrow band signal, comprising:
a polyphase filter having a specified number of filter branches, the polyphase filter decimating the signal by a decimation factor based on the specified number of filter branches, each filter branch operable to perform multiplications in substantially only the real domain; and
a periodic channel mixer having a periodic sequence of a multiple of the specified number of filter branches, the channel mixer coupled to the polyphase filter.

2. The system of claim 1, wherein the channel mixer produces a plurality of real outputs and a plurality of imaginary outputs, the system further comprising:
a real component summer receiving the real outputs of the channel mixer; and
an imaginary component summer receiving the imaginary outputs of the channel mixer.

3. The system of claim 2, wherein the real component summer produces a real component output and the imaginary component summer produces an imaginary component output, the system further comprising a fine-tune mixer receiving the real component output and the imaginary component output, the fine-tune mixer producing an in-phase output and a quadrature output.

4. The system of claim 2, wherein the real summer operates to produce a plurality of real summer outputs and the imaginary summer operates to produce a plurality of imaginary summer outputs, the system further comprising a positive/negative multiplier coupled to receive the real summer outputs and the imaginary summer outputs, the positive/negative multiplier operable to negate alternating real summer outputs and alternating imaginary summer outputs.

5. The system of claim 4, further comprising a fine-tune mixer coupled to the positive/negative multiplier, the fine-tune mixer operable to produce a plurality of in-phase outputs and a plurality of quadrature outputs.

6. The system of claim 1,
wherein each filter branch operates to produce a filter branch output; and
wherein the channel mixer comprises a plurality of mixer branches, each mixer branch operable to receive the filter branch output from a corresponding filter branch.

7. The system of claim 1,
wherein each filter branch operates to produce a filter branch output;
wherein the channel mixer comprises a plurality of mixer coefficients; and
wherein at least a portion of the mixer coefficients operate to mix at least one filter branch output.

8. The system of claim 1, wherein each filter branch comprises a plurality of filter coefficients, the filter coefficients based on a decomposition of a z-transform of a linear time-invariant filter into a plurality of components.

9. A method for down-converting a narrow band signal comprising:
filtering and decimating the narrow band signal with a polyphase filter to produce a plurality of filter outputs, the polyphase filter having a specified number of filter branches, wherein a decimation factor for decimating the signal comprises the specified number of filter branches, wherein filtering the narrow band signal comprises performing multiplications in substantially only the real domain; and
mixing the filter outputs with a channel mixer, the channel mixer being periodic with a period of twice the specified number of filter branches.

10. The method of claim 9, further comprising:
producing a plurality of real outputs and a plurality of imaginary outputs from the channel mixer;
summing the real outputs with a real summer; and
summing the imaginary outputs with an imaginary summer.

11. The method of claim 10, further comprising:
producing a real summer output from the real summer;
producing an imaginary summer output from the imaginary summer; and mixing the real summer output and the imaginary summer output with a fine-tune mixer to produce an in-phase output and a quadrature output.

12. The method of claim 10, further comprising:

producing a plurality of real summer outputs from the real summer;

producing a plurality of imaginary summer outputs from the imaginary summer; and negating alternating real summer outputs and alternating imaginary summer outputs with a positive/negative multiplier to produce a plurality of real multiplier outputs and a plurality of imaginary multiplier outputs.

13. The method of claim 12, further comprising mixing the real multiplier outputs and the imaginary multiplier outputs with a fine-tune mixer to produce a plurality of in-phase outputs and a plurality of quadrature outputs.

14. The method of claim 9, wherein the channel mixer comprises a plurality of mixer branches and further comprising producing a filter branch output from each filter branch to a corresponding mixer branch.

15. The method of claim 9, wherein the channel mixer comprises a plurality of mixer coefficients and further comprising:

producing a filter branch output from each filter branch; and mixing each filter branch output with at least a portion of the mixer coefficients.

16. The method of claim 9, wherein each filter branch comprises a plurality of filter coefficients and further comprising decomposing a z-transform of a linear time-invariant filter into a plurality of components to determine the filter coefficients.

17. A method for down-converting a wide band signal, comprising:

mixing the signal with an analog mixer to produce a mixed signal;

band-pass filtering the mixed signal to produce a band-pass filtered signal;

converting the band-pass filtered signal to a digital signal;

decimating the digital signal with a polyphase filter, the polyphase filter having a specified number of filter branches, wherein a decimation factor for decimating the signal comprises the specified number of filter branches;

filtering the digital signal with the polyphase filter to produce a plurality of filter outputs, wherein filtering the digital signal comprises performing multiplications in substantially only the real domain; and mixing the filter outputs with a channel mixer, the channel mixer being periodic with a period of twice the specified number of filter branches.

18. The method of claim 17, further comprising:

producing a plurality of real outputs and a plurality of imaginary outputs from the channel mixer;

summing the real outputs with a real summer to produce an in-phase output; and summing the imaginary outputs with an imaginary summer to produce a quadrature output.

19. The method of claim 17, wherein the channel mixer comprises a plurality of mixer branches and further comprising producing a filter branch output from each filter branch to a corresponding mixer branch.

20. The method of claim 17, wherein the channel mixer comprises a plurality of mixer coefficients and further comprising:

producing a filter branch output from each filter branch; and mixing each filter branch output with at least a portion of the mixer coefficients.

21. The method of claim 17, wherein each filter branch comprises a plurality of filter coefficients and further comprising decomposing a z-transform of a linear time-invariant filter into a plurality of components to determine the filter coefficients.

22. A system for down-converting a narrow band signal, comprising:

a polyphase filter having a specified number of filter branches, each filter branch producing a filter branch output, the polyphase filter decimating the signal by decimation factor based on the specified number of filter branches, each filter branch operable to perform multiplications in substantially only the real domain; and a channel mixer comprising a plurality of mixer branches, each branch receiving the filter branch output from a corresponding filter branch, the periodic channel mixer having a periodic sequence of multiple of the specified number of filter branches.

23. The system of claim 22, wherein the channel mixer operates to produce a plurality of real outputs and a plurality of imaginary outputs, the system further comprising:

a real output summer receiving the real outputs of the channel mixer and producing a real component output; and an imaginary output summer receiving the imaginary outputs of the channel mixer and producing an imaginary component output.

24. The system of claim 23, further comprising a fine-tune mixer receiving the real component output and the imaginary component output, the fine-tune mixer producing an in-phase output and a quadrature output.

25. The system of claim 23, wherein the real summer produces a plurality of real component outputs and the imaginary summer produces a plurality of imaginary component outputs, the system further comprising a positive/negative multiplier receiving the real component outputs and the imaginary component outputs, the positive/negative multiplier operable to negate alternating real component outputs and alternating imaginary component outputs.

26. The system of claim 25, further comprising a fine-tune mixer coupled to the positive/negative multiplier, the fine-tune mixer producing a plurality of in-phase outputs and a plurality of quadrature outputs.

27. The system of claim 22, wherein:

each filter branch produces a filter branch output; and the channel mixer comprises a plurality of mixer coefficients, at least a portion of the mixer coefficients mixing at least one filter branch output.

28. The system of claim 22, wherein each filter branch comprises a plurality of filter coefficients, the filter coefficients based on a decomposition of a z-transform of a linear time-invariant filter into a plurality of components.

29. A method for down-converting a signal, comprising:

filtering and decimating the signal with a polyphase filter having a specified number of filter branches and a decimation factor based on the specified number of filter branches, each filter branch producing a filter branch output, wherein filtering the signal comprises performing multiplications in substantially only the real domain; and periodic mixing each of the filter branch outputs with a periodic channel mixer having a periodic sequence of a multiple of the specified number of filter branches.

30. The method of claim 29, further comprising:

producing a plurality of real outputs and a plurality of imaginary outputs from the channel mixer;

summing the real outputs to produce a real component output; and summing the imaginary outputs to produce an imaginary component output.

31. The method of claim 29, further comprising:

producing a plurality of real component outputs;

producing a plurality of imaginary component outputs;

negating alternating real component outputs and alternating imaginary component outputs to produce a plurality of real multiplier outputs and a plurality of imaginary multiplier outputs; and mixing the real multiplier outputs and the imaginary multiplier outputs to produce a plurality of in-phase outputs and a plurality of quadrature outputs.

32. The method of claim 29, wherein each filter branch comprises a plurality of filter coefficients and further comprising decomposing a z-transform of a linear time-invariant filter into a plurality of components to determine the filter coefficients.

33. A method for down-converting a wide band signal, comprising:

mixing the signal with an analog mixer to produce a mixed signal;

band-pass filtering the mixed signal to produce a band-pass filtered signal;

converting the band-pass filtered signal to a digital signal;

decimating the digital signal with a polyphase filter, the polyphase filter having a specified number of filter branches, wherein a decimation factor for decimating the signal comprises the specified number of filter branches;

filtering the digital signal with the polyphase filter to produce a plurality of filter outputs;

mixing the filter outputs with a periodic channel mixer, the period comprising twice the specified number of filter branches;

producing a plurality of real outputs and a plurality of imaginary outputs from the channel mixer;

summing the real outputs with a real summer to produce a plurality of real summer outputs;

summing the imaginary outputs with an imaginary summer to produce a plurality of imaginary summer outputs; and negating alternating real summer outputs and alternating imaginary summer outputs with a positive/negative multiplier to produce a plurality of in-phase outputs and a plurality of quadrature outputs.

34. A method for down-converting a signal, comprising:

filtering and decimating the signal with a polyphase filter having a specified number of filter branches and a decimation factor based on the specified number of filter branches, each filter branch producing a filter branch output;

periodic mixing each of the filter branch outputs with a periodic channel mixer having a periodic sequence of a multiple of the specified number of filter branches;

producing a plurality of real component outputs;

producing a plurality of imaginary component outputs; and negating alternating real component outputs and alternating imaginary component outputs to produce a plurality of real multiplier outputs and a plurality of imaginary multiplier outputs.

* * * * *

UNITED STATES PATENT AND TRADEMARK OFFICE
CERTIFICATE OF CORRECTION

PATENT NO. : 6,452,982 B1
DATED : September 17, 2002
INVENTOR(S) : Stewart C. O'Dell et al.

It is certified that error appears in the above-identified patent and that said Letters Patent is hereby corrected as shown below:

<u>Title page, Item [54] and Column 1, line 1,</u>
After "SYSTEM FOR", delete "-".

<u>Title page,</u>
Item [56], References Cited, U.S. PATENT DOCUMENTS, insert --
3,808,412     A     4/1974   Smith........................235/152
4,316,282     A     2/1982   Macina.....................370/70
5,535,240     A     7/1996   Carney, et al...............375/219
5,606,575     A     2/1997   Williams....................375/219 --.
FOREIGN PATENT DOCUMENTS, after "EP 0 322", delete "027" and insert -- 024 --.
OTHER PUBLICATIONS, insert --
Hosking, Rodger H., Pentek Digital Receiver Handbook, Second Edition, "Theory of Operation Applications Products", 1998, pp. 1-32.
Harris Semiconductor, HSP50016, Digital Down Converter , spec. sheet, December 1996, 1 pg.
Harris Semiconductor, HSP50214, Programmable Downconverter, spec. sheet, February 1998, 1 pg.
McWilliams, Joel, et al. "A Multipurpose Wideband Digital Communications Receiver ASIC Design", pp. 398-402.
Srinivasan, Meera, et al, "All-Digital High Data Rate Parallel Receiver", pp. 243-247.
Zahirniak, Daniel R., et al, "A Hardware-Efficient, Multirate, Digital Channelized Receiver Architecture", IEEE Transactions of Aerospace and Electronic Systems, Vol. 34, No. 1, January 1998, pp. 137-152.
Jou, Shyh-Jye, et al. "Low-Power Multirate Architecture for IF Digital Frequency Down Converter", IEEE Transactions on Circuits and Systems-II: Analog and Digital Signal Processing, Vol. 45, No. II, November 1998, pp. 1487-1494.
Fudge, Jerry, et al, "An Approach to Efficient Wideband Digital Downconversion", The Proceedings of ICSPAT '98, September 13, 1998, pp 1-5.
Ferrara, Earl R., Jr., "Frequency-Domain Implementations of Periodically Time-Varying Filters", IEEE Transactions on Acoustics, Speech and Signal Processing, Vol. ASSP-33, No. 4, August 1985, pp 883-892. --.

UNITED STATES PATENT AND TRADEMARK OFFICE
CERTIFICATE OF CORRECTION

PATENT NO.    : 6,452,982 B1
DATED         : September 17, 2002
INVENTOR(S)   : Stewart C. O'Dell et al.

It is certified that error appears in the above-identified patent and that said Letters Patent is hereby corrected as shown below:

Column 10,
Line 10, after "signal by" insert -- a --.
Line 22, after "sequence of" insert -- a --.

Signed and Sealed this

Fifth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,452,982 B1
DATED        : September 17, 2002
INVENTOR(S)  : Stewart C. O'Dell et al.

It is certified that error appears in the above-identified patent and that said Letters Patent is hereby corrected as shown below:

<u>Column 10,</u>
Line 14, after "signal by" insert -- a --.

Signed and Sealed this

Ninth Day of December, 2003

JAMES E. ROGAN
*Director of the United States Patent and Trademark Office*